(12) United States Patent
Umans

(10) Patent No.: US 7,449,877 B1
(45) Date of Patent: Nov. 11, 2008

(54) CURRENT MEASUREMENT APPARATUS

(75) Inventor: Stephen D. Umans, Belmont, MA (US)

(73) Assignee: Reliance Electric Technologies LLC, Mayfield Heights, OH (US)

( * ) Notice: Subject to any disclaimer, the term of this patent is extended or adjusted under 35 U.S.C. 154(b) by 420 days.

(21) Appl. No.: 11/241,835

(22) Filed: Sep. 30, 2005

(51) Int. Cl.
    *G01R 1/20* (2006.01)
(52) U.S. Cl. .................................. 324/126; 324/158.1
(58) Field of Classification Search ................ None
    See application file for complete search history.

(56) References Cited

U.S. PATENT DOCUMENTS 4,818,895 A * 4/1989 Kaufman .................... 327/565
4,945,445 A * 7/1990 Schmerda et al. ........... 361/101
5,539,602 A * 7/1996 Schmitz et al. ............... 361/42

* cited by examiner

Primary Examiner—Minh N Tang
(74) Attorney, Agent, or Firm—Thompson Coburn LLP

(57) ABSTRACT

Apparatus and methods are provided for a system for measurement of a current in a conductor such that the conductor current may be momentarily directed to a current measurement element in order to maintain proper current without significantly increasing an amount of power dissipation attributable to the current measurement element or adding resistance to assist in current measurement. The apparatus and methods described herein are useful in superconducting circuits where it is necessary to monitor current carried by the superconducting elements while minimizing the effects of power dissipation attributable to the current measurement element.

42 Claims, 3 Drawing Sheets

CURRENT MEASUREMENT APPARATUS

GOVERNMENT INTEREST STATEMENT

This invention was made with Government support under Contract DE-FC36-93CH10580 awarded by the United States Department of Energy. The Government may have certain rights in the invention.

FIELD OF THE INVENTION

The present invention relates generally to measurement of current.

BACKGROUND

One of the chief features of superconducting wires is that they have extremely low (in the case of high-temperature superconductors) or zero (in the case of low temperature superconductors) resistance and hence dissipate little, if any, power. In many applications where they are used, it is necessary to monitor the current carried by the superconductor. The additional resistance and power dissipation associated with current-sensing systems, such as resistive current sensors, tends to defeat some of the advantage of using superconducting wire. Apparatus and techniques are needed to measure current in a conductor such as a superconducting wire in a straight forward manner without introducing additional resistance and power dissipation.

SUMMARY

The above mentioned problems are addressed by embodiments of the present invention and will be understood by reading and studying the following specification. In various embodiments, apparatus and methods provide a system for measurement of a current in a conductor such that the conductor current may be momentarily directed to a current-measurement element. These and other aspects, embodiments, advantages, and features will become apparent from the following description and the referenced drawings.

DETAILED DESCRIPTION

In the following detailed description of the invention, reference is made to the accompanying drawings which form a part hereof, and in which are shown by way of illustration, specific embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some embodiments can be combined with one or more other embodiments to form new embodiments. The following detailed description is, therefore, not to be taken in a limiting sense.

In an embodiment, current in a conductor may be momentarily directed through a current-measurement element to determine the amount of current in the conductor. Such a current measurement method may be used in a system where continuous current sensing is not required. In addition, such a current measurement method may be used in a system where power dissipation in a current-sensing element is of concern. For example, in situations where it is necessary that the current-sensing take place in a cryogenic environment, it may be desirable to eliminate power dissipation in a current-sensor. In an embodiment, current in a superconducting element may be momentarily directed through a current-measurement element to determine the amount of current in the superconducting element. The superconducting element may be, but is not limited to, a superconducting coil or a superconducting wire. The measured current may be compared against a threshold current level for operating the conductor. In an embodiment, if the measured current is less than the threshold current, a superconducting element may be charged to increase its current to a level above the threshold. In an embodiment, a superconducting coil may be in a persistent current mode in which current is continually flowing in the superconducting coil without constant coupling to a power source.

Figure 1:
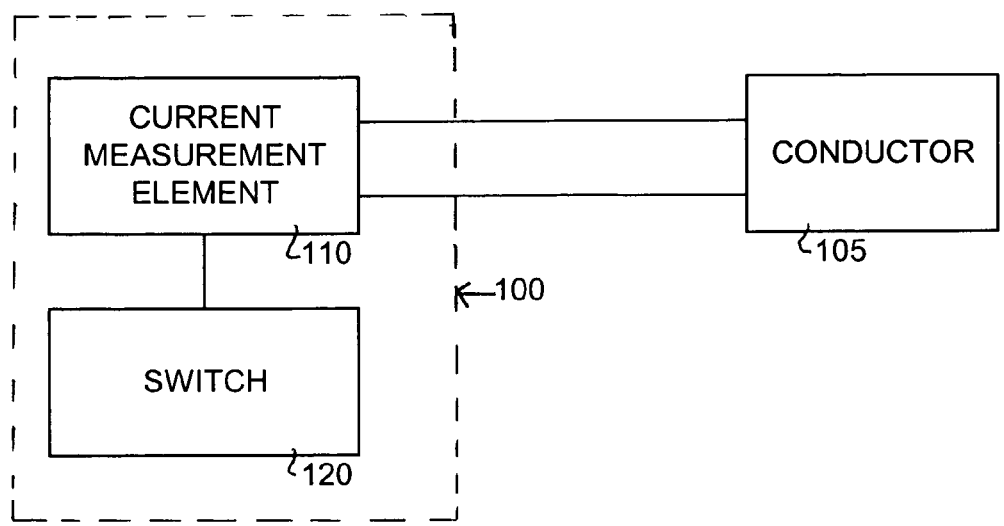
FIG. 1 illustrates a block diagram of features of an embodiment of a current measurement apparatus coupled to a conductor.

FIG. 1 illustrates a block diagram of features of an embodiment of a current measurement apparatus 100 coupled to a conductor 105. Current measurement apparatus 100 may include a current-measurement element 110 and a switch 120. Switch 120 may be a low-resistance switch that can be used to shunt current around current-measurement element 110 when current-measurement element 110 is not being used to measure the current flowing in conductor 105. Switch 120 provides a means to reduce the power dissipation of current-measurement element 110 that may be applicable to situations where continuous current measurement is not required. Conductor 105 may be an electrical conductor through which current flows such as a current-carrying wire. Conductor 105 may be a superconducting element such as a superconducting wire and/or a superconducting coil. Conductor 105 may be a current-carrying element in a cryogenic environment.

Current-measurement element 110 may be realized in various configurations. Current-measurement element 110 may be a resistor. Measurement of the voltage across the resistor, having a known resistance, determines the current through the resistor. Current-measurement element 110 may be a semiconductor device configured to function as a resistor. Current-measurement element 110 is not limited to a resistor or a semiconductor device configured to function as a resistor but may be realized as other components or elements having known characteristics to provide a measure of the current through the component.

Switch 120 may momentarily direct current from conductor 105 to current-measurement element 110. The switch may be realized as a semiconductor switch, a relay, other electronic and/or electro-mechanical switch, or a device to selectively direct current to current-measurement element 110. Semiconductor devices, such as MOSFETS, may be adapted as low-resistance shunt switches, especially when they are cooled to cryogenic temperatures, such as for embodiments in which current sensing takes place at cryogenic temperatures. In addition, semiconductor devices may be controlled in a straight forward manner. A semiconductor switch may include using a transistor arrangement in which one or more transistors may be turned on or off to momentarily provide a current path to current-measurement element 110. A semiconductor switch may include a MOSFET or other FET type device. The semiconductor switch may include bipolar transistors arranged to momentarily provide a current path to current-measurement element 110. A variety of devices and device arrangements may configured in various embodiments as a switch to momentarily provide a current path to current-measurement element 110.

In an embodiment, switch 120 momentarily directs conductor current through current-measurement element 110 for a period of time such that this period of time is short with respect to the period of time for which current does not flow in current-measurement element 110. By momentarily directing conductor current to current-measurement element 110, switch provides a short duty cycle for current measurement. In an embodiment, switch 120 may be opened for a time limited to the time necessary to measure the voltage across current-measurement element 110.

Figure 2:
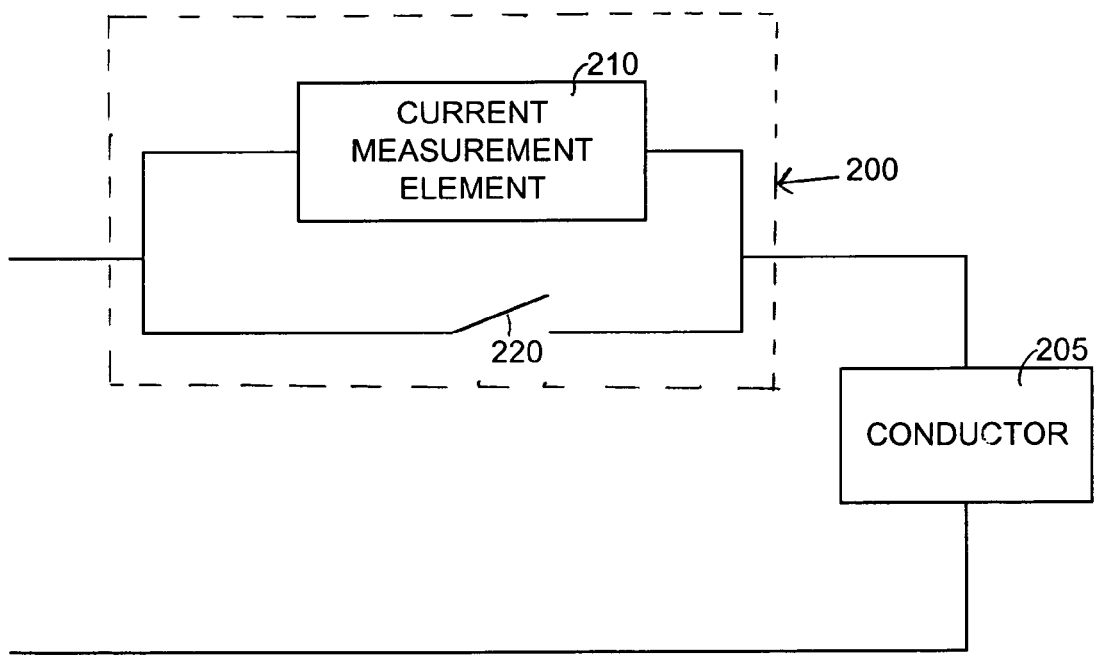
FIG. 2 illustrates a block diagram of a configuration of an embodiment of a current measurement apparatus coupled to a conductor.

FIG. 2 illustrates a block diagram of a configuration of an embodiment of a current measurement apparatus 200 coupled to a conductor 205. Current measurement apparatus 200 and conductor 205 may be used in a manner as discussed with respect to the arrangement of FIG. 1. Current measurement apparatus 200 may include a switch 220 connected in parallel with current-measurement element 210 across which a voltage may be measured to determine the current in conductor 205. Current-measurement element 210 may be a resistor having a known resistance or other component configured as a resistor having a known or calculable resistance. To reduce the power drain caused by current-measurement element 210, conductor 205 may be operated with switch 220 in a normally closed position such as to effectively provide a short circuit across current-measurement element 210 in which essentially no current flows through current-measurement element 210. This effective short circuit may be realized by a switch having a significantly small resistance compared with the resistance of current-measurement element 210. When switch 220 is momentarily opened, current flows from conductor 205 through current-measurement element 210, which provides a voltage that can be measured to determine the current flow. The current may be determined as the ratio of the measured voltage to the resistance of current-measurement element 210.

In an embodiment, conductor 205 may be a superconducting coil, where current measurement apparatus 200 provides a current-sense system that is in series with superconducting coil 205. This series configuration may couple to a power source or other means in which power is provided to superconducting coil 205. This coupling may provide constant current to superconducting coil 205. Switch 220 having a small resistance relative to current-measurement element 210 dissipates less power than having current-measurement element 210 in series with superconducting coil 105. Thus, once the current of superconducting coil 205 is measured by directing the current through current-measurement element 210, switch 220 may be closed to provide an effective short across current-measurement element 210. In an embodiment, switch 220 may be opened for a time limited to the time necessary to measure the voltage across current-measurement element 210.

Figure 3:
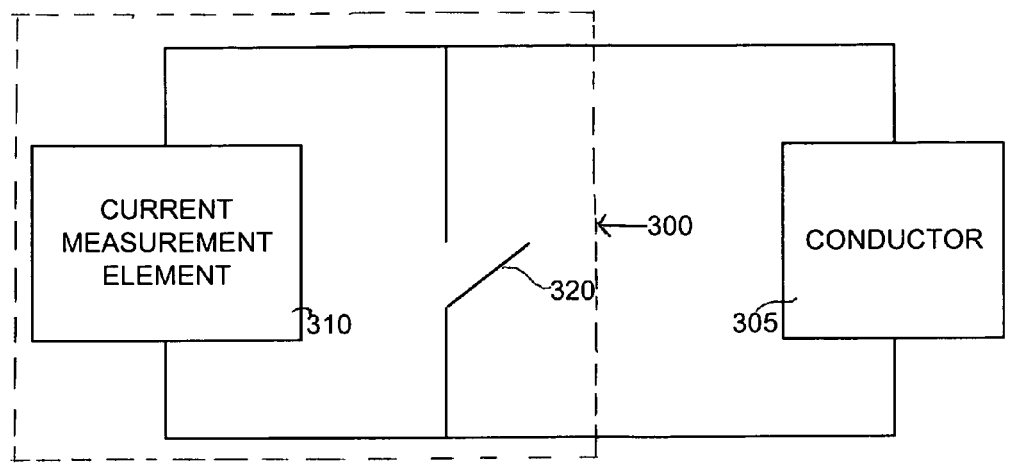
FIG. 3 illustrates a block diagram of a configuration of an embodiment of a current measurement apparatus coupled to a conductor.

FIG. 3 illustrates a block diagram of a configuration of an embodiment of a current measurement apparatus 300 coupled to a conductor 305. Current measurement apparatus 300 and conductor 305 may be used in a manner as discussed with respect to the arrangement of FIG. 1. In an embodiment, conductor 305 may be a superconducting element 305 such as a superconducting wire or superconducting coil. Current measurement apparatus 300 provides a current-sense system that is in series with superconducting element 305. In an embodiment, a superconducting coil 305 may operate in a persistent current mode. A persistent current mode is an arrangement in which a superconducting coil is brought to an operating current, is provided with a short circuit across the superconducting coil, is disconnected from the power source that provided the current to the superconducting coil, and operates with current continually flowing through it. With no resistance, a superconducting loop, which includes the superconducting coil in a closed loop, may operate with current flowing through it indefinitely. However, there is some resistance associated with superconducting coils and the leads providing the closed loop configuration, especially those superconducting coils operating at elevated temperatures. Thus, the current in a superconducting coil operating in a persistent current mode may decay over time. Such decay may be relatively slow.

In an embodiment, conductor 305 is a superconducting coil 305, where current measurement apparatus 300 includes a switch 320 connected in parallel with current-measurement element 310 across which a voltage may be measured to determine the current in superconducting coil 305. Current-measurement element 310 may be a resistor or other component configured as a resistor. To reduce the power drain caused by current-measurement element 310, superconducting coil 305 may be operated with switch 320 in a normally closed position such as to effectively provide a short circuit across current-measurement element 310 in which essentially no current flows through current-measurement element 310. This effective short circuit may be realized by a switch having a significantly small resistance compared with current-measurement element 310. Power dissipation in switch 320 having a small resistance will cause the current to decay in superconducting coil 305. Switch 320 may be selected based on acceptable current decay rates for superconducting coil 305. When switch 320 is momentarily opened, current flows from superconducting coil 305 through current-measurement element 310, which provides a voltage across current-measurement element 310. This voltage may be measured to determine the current flow. Once the current is measured, switch 320 may be closed to once again provide an effective short across current-measurement element 310. In an embodiment, switch 320 may be opened for a time limited to the time necessary to measure the voltage across current-measurement element 310.

Figure 4:
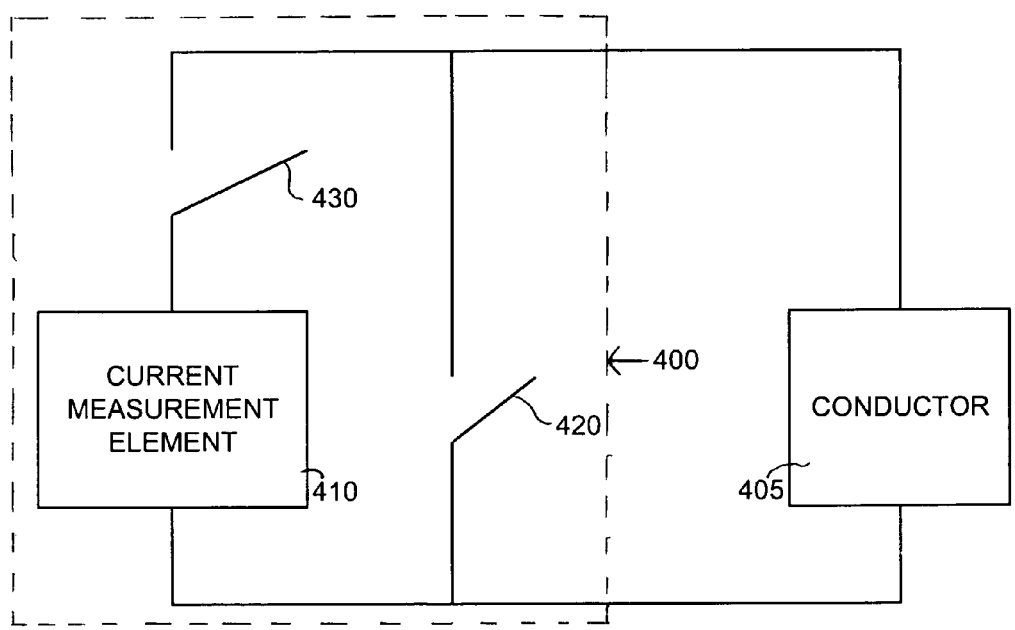
FIG. 4 illustrates a block diagram of a configuration of an embodiment of a current measurement apparatus coupled to a conductor including a switch to completely eliminate current flow to a current-measurement element.

FIG. 4 illustrates a block diagram of a configuration of an embodiment of a current measurement apparatus coupled to a conductor including a switch to completely eliminate current flow to a current-measurement element. Current measurement apparatus 400 and conductor 405 may be used in a manner as discussed with respect to the arrangement of FIG. 1. In an embodiment, conductor 405 may be, but is not limited to, a semiconductor coil.

In an embodiment, current measurement apparatus 400 provides a current-sense system that is in series with a superconducting coil 405. In conjunction with this configuration, superconducting coil 405 may operate in a persistent current mode. Current measurement apparatus 400 may include a switch 420 connected in parallel with a series combination of current-measurement element 410 and a switch 430. A voltage may be measured across current-measurement element 410 to determine the current in superconducting coil 405. Current-measurement element 410 may be a resistor or other component configured as a resistor. To reduce the current decay caused by current-measurement element 410, superconducting coil 405 may operate with switch 420 in a normally closed position such as to effectively provide a short circuit across the series combination of current-measurement element 410 and switch 430. In an embodiment, switch 430 may be open when switch 420 is closed so that no current flows through current-measurement element 410. Switch 420 having a small resistance will cause the current to decay in superconducting coil 405. Switch 420 may be selected based on acceptable current decay rates for superconducting coil 405. When switch 420 is momentarily opened and switch 430 is momentarily closed, current flows from superconducting coil 405 through current-measurement element 410, which provides a voltage. This voltage may be measured to determine the current flow. Once the current is measured, switch 420 may be closed and switch 430 opened, to once again eliminate current flow to current-measurement element 410. In an embodiment, switch 430 may be closed to effectively generate the configuration of FIG. 3. With switch 430 closed, the effective short circuit provided by a closed switch 420 may be realized by switch 420 having a significantly small resistance compared with current-measurement element 410. In an embodiment, switch 420 is opened and switch 430 is closed for a time limited to the time necessary to measure the voltage across current-measurement element 410.

Figure 5:
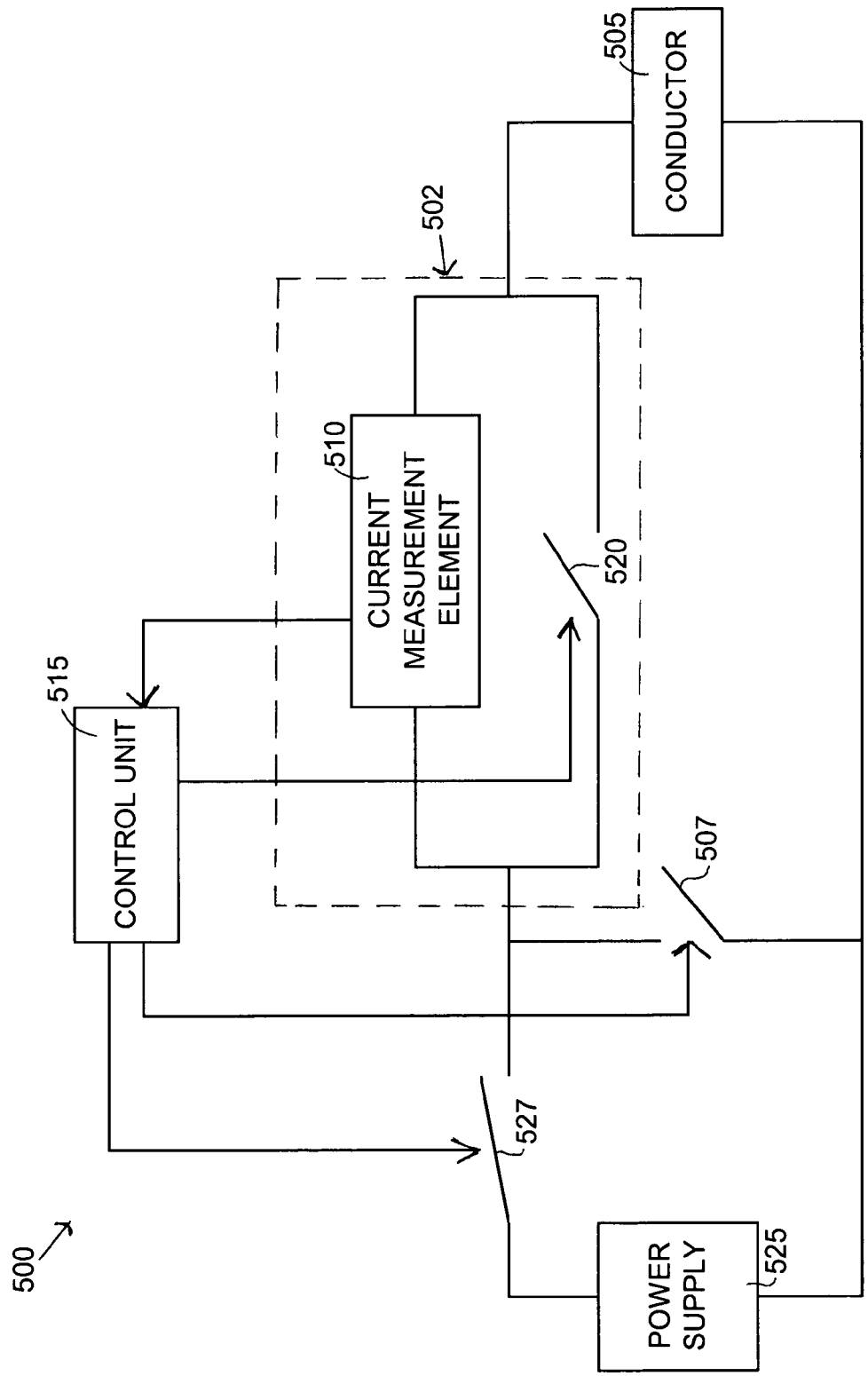
FIG. 5 illustrates a block diagram of a system having an embodiment of a current measurement apparatus coupled to a conductor.

FIG. 5 illustrates a block diagram of a system 500 having an embodiment of a current sense apparatus 502 coupled to a conductor 505. Conductor 505 may be any current-carrying element of system 500. In various embodiments, the current sense apparatus 502 may be configured in manner as shown in FIGS. 1-4. In addition to current sense apparatus 502, system 500 may include a power supply 525 and a control unit 515. Control unit 515 may manage operation of switches 507, 527, and 520. Switches 507, 527, and 520 may each be realized as a semiconductor switch, a relay, other electronic and/or electro-mechanical switch, or a device to selectively direct current to current-measurement element 510. A semiconductor switch may include using a transistor arrangement in which one or more transistors may be turned on or off to momentarily provide a current path to current-measurement element 510. A semiconductor switch may include a MOSFET or other FET type device.

In an embodiment, system 500 may include a superconducting coil 505 in which a switch 507 may be operated to place superconducting coil in a persistent current mode. With switch 527 closed and switch 507 open, power supply 525 may charge superconducting coil 505 to a desired operating current level. In embodiment, switch 520 may be open while charging superconducting coil 505, so that current sense apparatus 502 will be active. With current sense apparatus 502 active, control unit 515 may monitor the coil current. When the desired current level is achieved, control unit 515 may close switch 507 to short superconducting coil 505 for persistent current operation. Control unit 515 may open switch 527 to disconnect power supply 525. Alternatively, control unit 515 may shut off power supply 525, in which case, depending on the type of power supply, switch 527 may be eliminated from the configuration for system 500. Current will flow through the shorted loop with a time constant determined by the coil inductance and the net series resistance in the loop. Control unit 515 may also close switch 520 so that current sense apparatus 502 does not dissipate energy. Control unit 515 may periodically open switch 520 so that current sense apparatus 502 may provide a measure of the coil current.

At a point at which control unit 515 determines that the coil current has dropped by a pre-specified amount or has dropped below a threshold level, control unit 515 may open switch 507, close switch 527 (or turn on power supply 525) to couple power from power supply 525 to superconducting coil 505, and open switch 520 to monitor the coil current. These switches remain in these states until the coil current is increased to the desired level. In an embodiment, the threshold is set at 95% of a selected operating current for superconducting coil 505. The threshold may be set at other levels depending on the application. After the desired level for the coil current is achieved, superconducting coil 505 may be placed back in the persistent current mode as described above. Control unit 505 may continue the cycle of periodically monitoring the coil current and recharging the current in superconducting coil 505.

In an embodiment, system 500 may be a system that uses current sensing apparatus 502 to periodically measure the current in conductor 505 in a manner similar to that discussed herein. In an embodiment, system 500 includes a superconducting coil 505 configured as a direct current (DC) magnet. In an embodiment, system 500 includes a rotating machine. In an embodiment, system 500 includes a superconducting motor or generator. In an embodiment, system 500 is configured to use a current sensing scheme in which a very low resistance switch may momentarily direct current from conductor 505 to current-measurement element 510 to determine the current of conductor 505. Current-measurement element 510 may effectively be out of the circuit in which current flows through conductor 505 during times in which a current measurement is not being made.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments, and other embodiments, will be apparent to those of skill in the art upon studying the above description.

What is claimed is:

1. An apparatus comprising:
   a current-measurement element for measuring current in an electrical conductor; and
   a switching element for switching between first and second positions, wherein the first position the switching element momentarily aligns conductor current to the current measurement element in a manner to allow current measurement in the conductor, and wherein the second position the switching element shunts current from the current-measurement element to reduce power dissipation attributed to the current-measurement element and to restore current to the conductor.

2. The apparatus of claim 1, wherein the switching element is configured to operate in a cryogenic environment.

3. The apparatus of claim 1, wherein the current-measurement element is configured to operate in a cryogenic environment.

4. The apparatus of claim 1, wherein the switching element first position corresponds to an open state to switch the current-measurement element in series with the electrical conductor.

5. The apparatus of claim 4, wherein the switching element is maintains the open state for a time period, the time period having a maximum length substantially equal to a length of time to measure the current in the electrical conductor.

6. The apparatus of claim 1, wherein the switching element is in parallel with the current-measurement element.

7. The apparatus of claim 1, wherein the electrical conductor is configured to operate in a cryogenic environment.

8. The apparatus of claim 1, wherein the electrical conductor includes a superconducting element.

9. An apparatus comprising:
a current-measurement element; and
a means to momentarily direct current from a superconducting coil to the current-measurement element in a manner to allow current measurement in the superconducting coil and to direct current from the current-measurement element to the superconducting coil to reduce power dissipation attributed to the current-measurement element and to restore power to the superconducting coil.

10. The apparatus of claim 9, wherein the means to momentarily direct current includes the means configured to momentarily direct current with the superconducting coil in a persistent current mode.

11. The apparatus of claim 9, wherein the current-measurement element includes a resistor.

12. The apparatus of claim 9, wherein the apparatus includes a control unit to compare an amount of current measured in the current-measurement element to a threshold current level for the superconducting coil.

13. The apparatus of claim 12, wherein the apparatus includes a current supply to charge the superconducting coil to a current level above the threshold current level.

14. An apparatus comprising:
a current-measurement element; and
a semiconductor switch having first and second states, wherein the first state the semiconductor switch momentarily directs current from a superconducting coil to the current-measurement element in a manner to allow current measurement in the conductor, and a second state wherein the semiconductor switch directs current from the current-measurement element to the superconducting coil to reduce power dissipation attributed to the current-measurement element and to restore power to the superconducting coil.

15. The apparatus of claim 14, wherein the semiconductor switch includes a MOSFET switch.

16. The apparatus of claim 14, wherein the current-measurement element and the semiconductor switch are configured to operate in a cryogenic environment.

17. The apparatus of claim 14, wherein the apparatus includes a control unit to compare a measured current of the superconducting coil with a threshold current level.

18. The apparatus of claim 17, wherein the apparatus includes a power supply to charge the superconducting coil to a current level above the threshold current level.

19. The apparatus of claim 1 further comprising, a control unit configured to manage the switch to momentarily direct current from the electrical conductor.

20. The apparatus of claim 1 further comprising, a control unit configured to compare a measured current of the electrical conductor with a threshold current level.

21. The apparatus of claim 1, wherein the apparatus comprises a superconducting motor or generator.

22. The apparatus of claim 1, wherein the switching element comprises a semiconductor switch.

23. The apparatus of claim 8, wherein the switching element is coupled in parallel with the current-measurement element such that the switching element open position momentarily directs current from the superconducting element to the current-measurement element.

24. The apparatus of claim 23, wherein the superconducting element is in series with the parallel coupling of the switch and the current-measurement element.

25. The apparatus of claim 23, wherein the switching element includes a MOSFET switch.

26. The apparatus of claim 23, wherein the switching element closed position operates the superconducting element in a persistent current mode.

27. The apparatus of claim 23 further comprising, a second switch, the second switch coupled to the current-measurement element to form a series combination, the series combination coupled in parallel with the switching element, such that the switching element open position directs the current from the superconducting element to the current-measurement element with the second switch in a closed position.

28. The apparatus of claim 27, wherein the switching element in the closed position operates the superconducting element in a persistent current mode.

29. The apparatus of claim 27, wherein the switching element includes a MOSFET switch and the second switch includes a MOSFET switch.

30. A method comprising:
providing a switch with first and second positions, wherein the first position the switch momentarily aligns conductor current to a current-measurement element in a manner to allow current measurement in the conductor, and wherein the second position the switch directs current from the current-measurement element to the conductor to reduce power dissipation of the current-measurement element;
switching the switch to the first position to momentarily direct current from the conductor to the current-measurement element to determine an operating current in the conductor; and
switching the switch to the second position to direct current from the current-measurement element to the conductor in a manner to reduce power dissipation attributed to the current-measurement element and to restore power to the conductor.

31. The method of claim 30, wherein the method includes operating in a cryogenic environment.

32. The method of claim 30, wherein momentarily directing current from the conductor includes momentarily directing current from a superconducting coil to the current-measurement element to determine an operating current in the superconducting coil.

33. The method of claim 32, wherein momentarily directing current from a superconducting coil includes momentarily directing current from the superconducting coil with the superconducting coil in a persistent current mode.

34. The method of claim 32, wherein the method includes comparing a measured current of the superconducting coil with a threshold current for the superconducting coil.

35. The method of claim 34, wherein the method includes charging the superconducting coil to a current level above the threshold current.

36. The method of claim 32, wherein momentarily directing current from a superconducting coil to a current-measurement element includes momentarily opening the switch to direct the current to the current-measurement element in series with the superconducting coil.

37. The method of claim 36, wherein momentarily opening the switch includes momentarily opening a semiconductor switch.

38. The method of claim 37, wherein momentarily opening a semiconductor switch includes momentarily opening a MOSFET switch.

39. The method of claim 32, wherein the step of switching the switch to the first position, further comprises operating the superconducting coil in a persistent current mode.

40. The method of claim 39, wherein the switch comprises a MOSFET switch.

41. The method of claim 39, wherein the switch comprises first and second switching elements and the step of switching the switch to the first position includes momentarily closing the first switching element to direct the current to the current-measurement element, and momentarily opening the second switching element, the second switching element being momentarily opened during a period of time while the first switching element is closed.

42. The method of claim 41, wherein the second switching element includes a MOSFET switch.

* * * * *